(12) United States Patent
Ishikawa et al.

(10) Patent No.: US 9,532,461 B2
(45) Date of Patent: Dec. 27, 2016

(54) MANUFACTURING APPARATUS OF ELECTRONIC COMPONENT AND MANUFACTURING METHOD THEREOF

(71) Applicant: TDK CORPORATION, Tokyo (JP)

(72) Inventors: Naozumi Ishikawa, Tokyo (JP); Fumio Watanabe, Tokyo (JP); Hiroshi Kamiyama, Tokyo (JP)

(73) Assignee: TDK CORPORATION, Tokyo (JP)

( * ) Notice: Subject to any disclaimer, the term of this patent is extended or adjusted under 35 U.S.C. 154(b) by 122 days.

(21) Appl. No.: 14/224,712

(22) Filed: Mar. 25, 2014

(65) Prior Publication Data

US 2014/0293258 A1    Oct. 2, 2014

(30) Foreign Application Priority Data

Mar. 27, 2013 (JP) ................................. 2013-065537

(51) Int. Cl.
*G03B 27/68* (2006.01)
*H05K 3/00* (2006.01)
*H05K 1/02* (2006.01)
*H05K 1/16* (2006.01)

(52) U.S. Cl.
CPC .......... *H05K 3/0008* (2013.01); *H05K 1/0269* (2013.01); *H05K 1/165* (2013.01); *H05K 3/0002* (2013.01); *H05K 2201/09781* (2013.01); *H05K 2201/09918* (2013.01); *H05K 2203/056* (2013.01); *H05K 2203/166* (2013.01)

(58) Field of Classification Search
CPC .................. H05K 1/0269; H05K 1/165; H05K 2201/09781;H05K 2201/09918; H05K 2203/056; H05K 2203/166; H05K 3/0002; H05K 3/0008; H05K 3/064
See application file for complete search history.

(56) References Cited

U.S. PATENT DOCUMENTS

| | | | |
|---|---|---|---|
| 5,042,709 A | 8/1991 | Cina et al. | |
| 5,923,996 A * | 7/1999 | Shih ..................... | H01L 23/544 257/E23.179 |
| 6,118,516 A * | 9/2000 | Irie ..................... | G03F 7/70125 355/53 |
| 6,925,203 B1 * | 8/2005 | Tanaka .................. | G03F 9/7088 250/559.36 |

(Continued)

FOREIGN PATENT DOCUMENTS

| JP | 57-094941 U | 6/1982 |
|---|---|---|
| JP | 62-024259 | 2/1987 |

(Continued)

OTHER PUBLICATIONS

Japan Office action in Japan Patent Application No. 2013-65537, dated Aug. 26, 2014 along with an english translation thereof.

*Primary Examiner* — Deoram Persaud
(74) *Attorney, Agent, or Firm* — Greenblum & Bernstein P.L.C.

(57) ABSTRACT

A first alignment mark is given to a substrate, and a second alignment mark is given to a mask. The mask forms an electronic circuit pattern on the substrate. A control unit performs alignment of the mask and the substrate based on the first and second alignment marks. The second alignment mark is formed to surround the first alignment mark. The second alignment mark has a step pattern therein.

11 Claims, 10 Drawing Sheets

(56) References Cited

U.S. PATENT DOCUMENTS

| | | | |
|---|---|---|---|
| 2001/0017395 A1* | 8/2001 | Takamura | H01L 27/0688 257/531 |
| 2004/0037458 A1* | 2/2004 | Peak | G06K 9/3216 382/151 |
| 2004/0185637 A1* | 9/2004 | Fu | H01L 21/76229 438/401 |
| 2005/0282396 A1* | 12/2005 | Lin | H01L 21/31111 438/745 |
| 2010/0129026 A1* | 5/2010 | Hodono | G02B 6/42 385/14 |
| 2015/0249054 A1* | 9/2015 | Tian | H01L 23/544 257/797 |

FOREIGN PATENT DOCUMENTS

| | | |
|---|---|---|
| JP | 04-230050 | 8/1992 |
| JP | 2000-252189 | 9/2000 |
| JP | 2011-009273 | 1/2011 |

* cited by examiner

MANUFACTURING APPARATUS OF ELECTRONIC COMPONENT AND MANUFACTURING METHOD THEREOF

BACKGROUND OF THE INVENTION

Field of the Invention

The present invention relates to a manufacturing apparatus of an electronic component and a manufacturing method thereof.

Description of Related Art

In a manufacturing process of a surface mount inductor, a photoresist formed on a wafer serving as a substrate is exposed via a mask having a coil pattern formed thereon, so that the coil pattern is formed on the substrate. A mark referred to as "alignment mark" is given to the substrate and the mask respectively, and alignment of the alignment marks is performed, so that a relative position of the substrate and the mask is adjusted. Generally, the alignment mark of the substrate is usually formed in a cross shape by a plating method and the like (see Japanese Patent Application Laid-open Nos. 2011-009273 and 2000-252189).

Along with downsizing of electronic products, it is also required to downsize electronic components including a surface mount inductor. Therefore, it is necessary to have higher accuracy of alignment of a substrate and a mask.

However, when a cross-shaped alignment mark is downsized, it is difficult to detect an end portion of the cross shape. For example, in a case of an alignment mark formed by a plating method, an end portion becomes slightly rounded, and the linearity of a cross shape is easily degraded and the width thereof easily becomes uneven.

SUMMARY

The present invention has been achieved in view of the above problems, and an object of the present invention is to provide a manufacturing method of an electronic component, that is, a more precise alignment method of a substrate and a mask based on an alignment mark of a new shape.

A manufacturing apparatus of an electronic component according to the present invention comprises a substrate that has a first alignment mark, a mask that has a second alignment mark and prints an electronic circuit pattern on the substrate, and a control unit that performs alignment of the mask and the substrate based on the first and second alignment marks. The first and second alignment marks are formed so that one surrounds the other, and an alignment mark on a surrounding side has a step pattern therein.

By arranging such a step pattern, depending on the amount of overlapping of the first and second alignment marks, a change in the shape of a composite image (a silhouette image) of these marks can be easily viewed, and thus it is easy to improve the accuracy of alignment.

An alignment mark on a surrounded side can have a portion that extends linearly. The control unit can adjust a relative position of the mask and the substrate based on the amount of overlapping of the step pattern of the alignment mark on the surrounding side and the linear portion of the alignment mark on the surrounded side. The step pattern can include two steps or three or more steps. The alignment mark on the surrounded side can have a cross shape. The alignment mark on the surrounding side can be constituted by four parts that surround the alignment mark on the surrounded side from four corners.

The alignment mark on the surrounding side can have the step pattern respectively in two directions corresponding to the cross shape of the alignment mark on the surrounded side. An inductor pattern can be printed on the substrate as the electronic circuit pattern by the mask.

A manufacturing apparatus of an electronic component according to another aspect of the present invention comprises a substrate that has a first alignment mark, a mask that has a second alignment mark and prints an electronic circuit pattern on the substrate, and a control unit that performs alignment of the mask and the substrate based on the first and second alignment marks. The first and second alignment marks are formed so that one surrounds the other, and an alignment mark on a surrounded side has a step pattern on outside thereof.

The control unit can adjust a relative position of the mask and the substrate based on the amount of overlapping of a linear portion inside of an alignment mark on the surrounding side and the step pattern of the alignment mark on the surrounded side.

A manufacturing method of an electronic component according to the present invention comprises a first step of moving one or both of a substrate and a mask that has an electronic circuit pattern to perform alignment of a first alignment mark of the substrate and a second alignment mark of the mask and a second step of exposing the mask after the alignment to expose the electronic circuit pattern on the substrate. The first and second alignment marks are formed so that one surrounds the other, and an alignment mark on a surrounding side has a step pattern therein.

A manufacturing method of an electronic component according to another aspect of the present invention comprises a first step of moving one or both of a substrate and a mask that has an electronic circuit pattern to perform alignment of a first alignment mark of the substrate and a second alignment mark of the mask and a second step of exposing the mask after the alignment to expose the electronic circuit pattern on the substrate. The first and second alignment marks are formed so that one surrounds the other, and an alignment mark on a surrounded side has a step pattern on outside thereof.

According to the present invention, in a manufacturing process of an electronic component, the accuracy of alignment of a substrate and a mask can be improved.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

A preferred embodiment of the present invention will be described with reference to the accompanying drawings.

Figure 1:
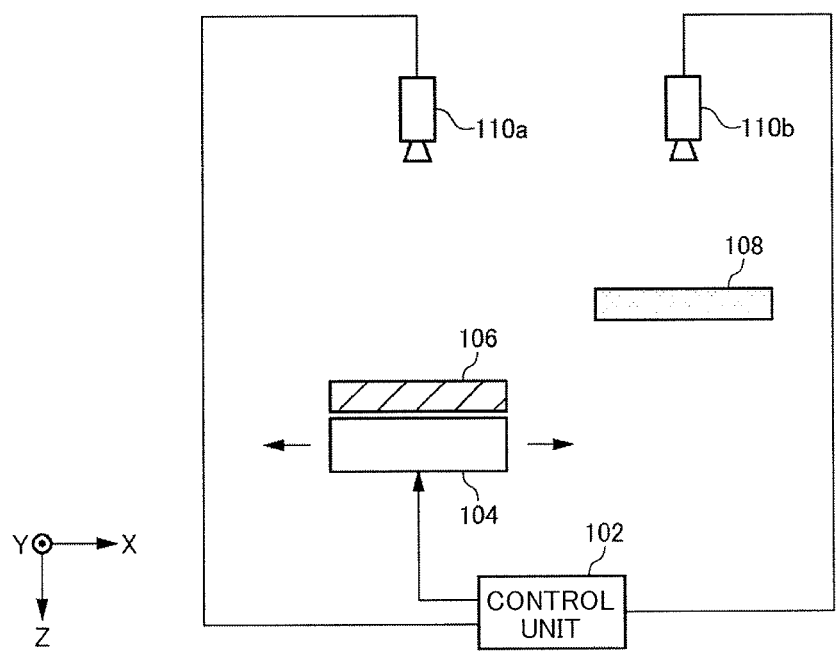
FIG. 1 is a schematic diagram of a manufacturing apparatus.

FIG. 1 is a schematic diagram of an example of a manufacturing apparatus 100 of an electronic component according to embodiments (first and second embodiments) of the present invention. A workpiece 106 is a wafer (substrate) having a photoresist applied thereon and placed on a stage 104. An electronic circuit pattern is formed on a mask 108. The manufacturing apparatus 100 according to the embodiments moves the stage 104 in an X-Y direction (a horizontal direction) and performs alignment of the workpiece 106 and the mask 108, and then exposes the workpiece 106 from a Z direction (a vertical direction) via the mask 108, thereby forming the electronic circuit pattern on the workpiece 106.

While the mask 108 is fixed and the workpiece 106 is configured to be movable in the embodiments, the mask 108 can be configured to be movable or both the mask 108 and the workpiece 106 can be configured to be movable. Furthermore, while the embodiments explain that the manufacturing apparatus 100 is an exposure apparatus that prints a plurality of coil patterns on the workpiece 106, the manufacturing apparatus 100 can be also applied to an apparatus that prints other electronic circuit patterns such as transistors and wires.

A mark referred to as "alignment mark M" is given to surfaces of the workpiece 106 and the mask 108. Details of the position and shape of the alignment mark M are explained later. The alignment marks M of the workpiece 106 and the mask 108 are captured by cameras 110a and 110b from the Z direction. While two cameras 110 are shown in FIG. 1, the number of the cameras 110 is arbitrary. A control unit 102 obtains images of the alignment mark M captured by the cameras 110a and 110b and moves the stage 104 horizontally so that the position (the X-Y coordinate) of an alignment mark M1 (first alignment mark) of the workpiece 106 matches the position of an alignment mark M2 (second alignment mark) of the mask 108. The control unit 102 moves the stage 104 and finely adjusts the position of the stage 104 (the mask 108) based mainly on an image captured by the camera 110b. When the positions of the two alignment marks M1 and M2 match with each other, the control unit 102 stops the stage 104. After the stage 104 stops, the workpiece 106 is exposed by a light source (not shown) via the mask 108, so that an inductor coil pattern is formed on the workpiece 106.

Figure 2:
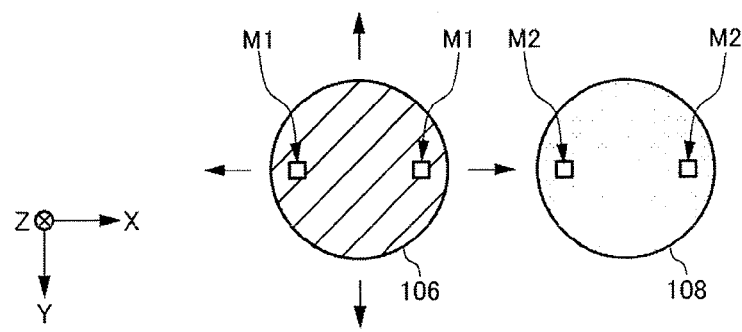
FIG. 2 is the workpiece and the mask as viewed from the side of a camera.

FIG. 2 shows the workpiece 106 and the mask 108 as viewed from the side of a camera. Two alignment marks M1 are formed on the workpiece 106. Two alignment marks M2 are also formed at positions of the mask 108 that correspond respectively to the two alignment marks M1 of the workpiece 106. The control unit 102 moves the workpiece 106 in an X-Y plane direction to perform alignment of the two alignment marks M1 and the two alignment marks M2. The number of the alignment marks M is not limited to two, and one or three or more alignment marks M can be formed.

Figure 3A:
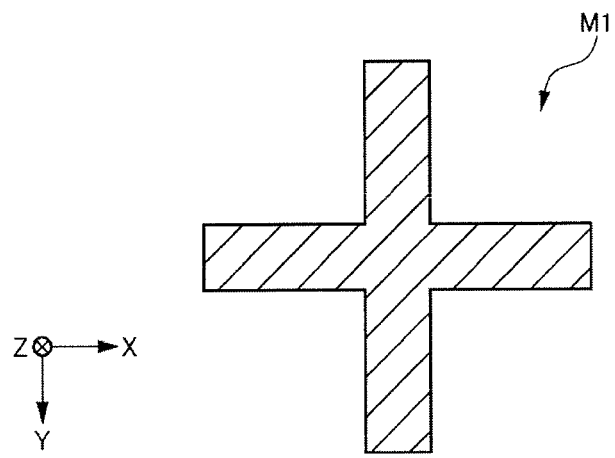
FIG. 3A shows a general alignment mark in a cross shape.
Figure 3B:
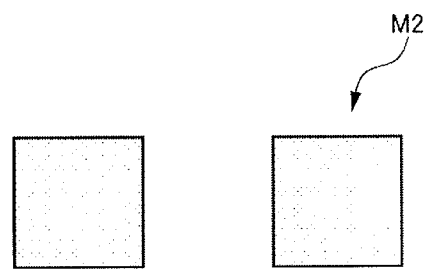
FIG. 3B shows a general alignment mark having four parts.
Figure 3B:
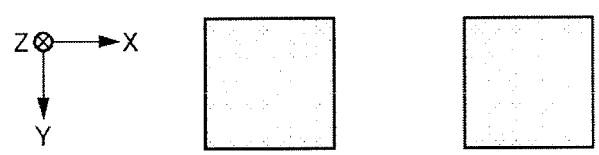

FIGS. 3A and 3B show general alignment marks M1 and M2. For example, the alignment mark M1 of the workpiece 106 is formed in a cross shape. Meanwhile, for example, the alignment mark M2 of the mask 108 is formed in a shape having four squares arranged therein (hereinafter, "four-part shape"). It is needless to mention that the alignment mark M1 can be formed in a four-part shape and the alignment mark M2 can be formed in a cross shape.

Figure 4:
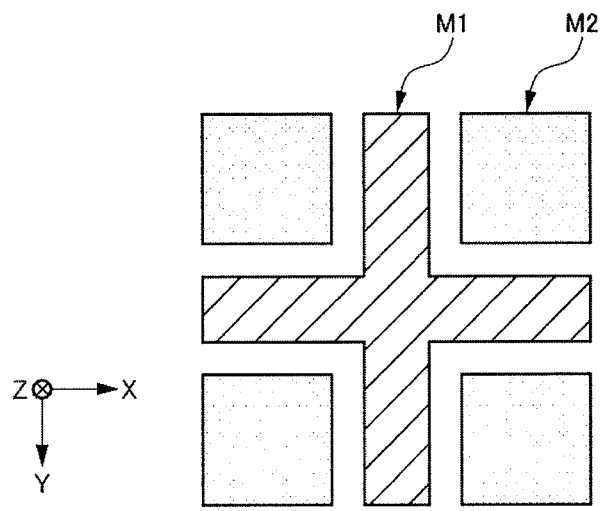
FIG. 4 shows a state where alignment of the alignment marks is successful.

FIG. 4 shows a state where alignment of the alignment marks M1 and M2 shown in FIGS. 3A and 3B is successful. As shown in FIG. 4, the control unit 102 moves the stage 104 to a position where the alignment mark M1 on a surrounded side is completely surrounded by the alignment mark M2 on a surrounding side, in other words, to a position where the alignment mark M1 does not overlap the alignment mark M2. With such control, alignment of the workpiece 106 and the mask 108 is performed.

Figure 5:
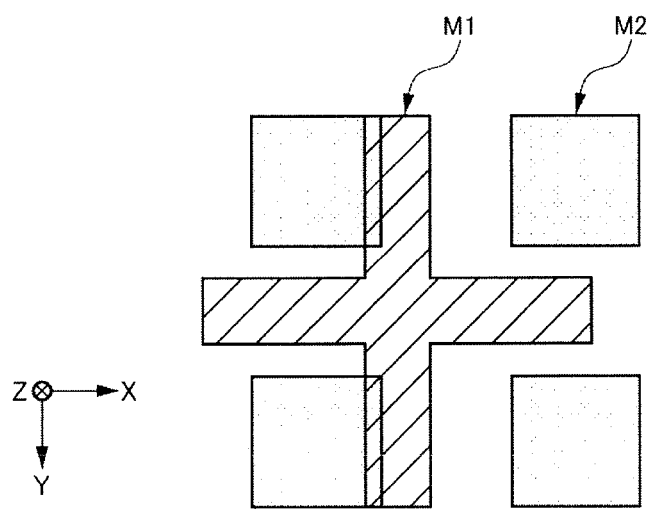
FIG. 5 shows a state where alignment of the alignment marks is failed.

FIG. 5 shows a state where alignment of the alignment marks M1 and M2 shown in FIGS. 3A and 3B is failed. In FIG. 5, the alignment mark M1 is shifted in a −X direction as compared to FIG. 4. Therefore, the alignment mark M1 is not completely surrounded by the alignment mark M2 and the alignment mark M1 partially overlaps the alignment mark M2. In the state of FIG. 5, the control unit 102 moves the alignment mark M1 in a +X direction.

Figure 6:
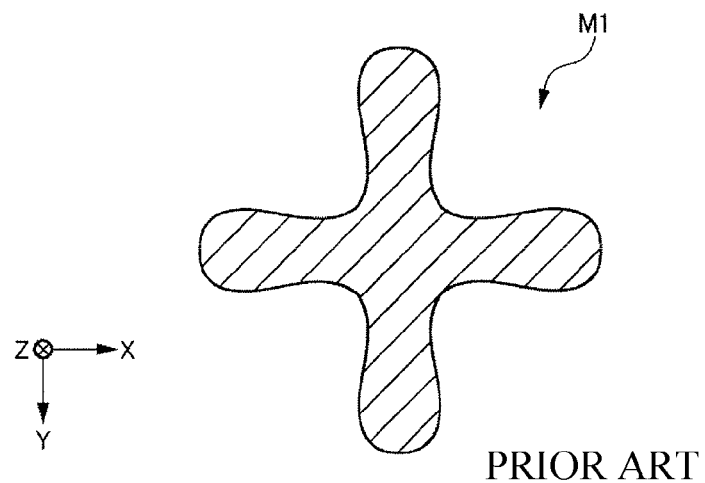
FIG. 6 is an actual form of cross-type alignment mark M1.

However, as explained above, because the alignment mark M1 of the workpiece 106 is formed by a plating method and the like, in practice, an end portion of the alignment mark M1 becomes rounded, an edge thereof becomes curved, and the width thereof becomes not uniform (see FIG. 6). Accordingly, even when the control unit 102 can determine that the alignment mark M1 should be moved in the +X direction, it is difficult for the control unit 102 to correctly estimate the amount of movement.

First Embodiment

Figure 7:
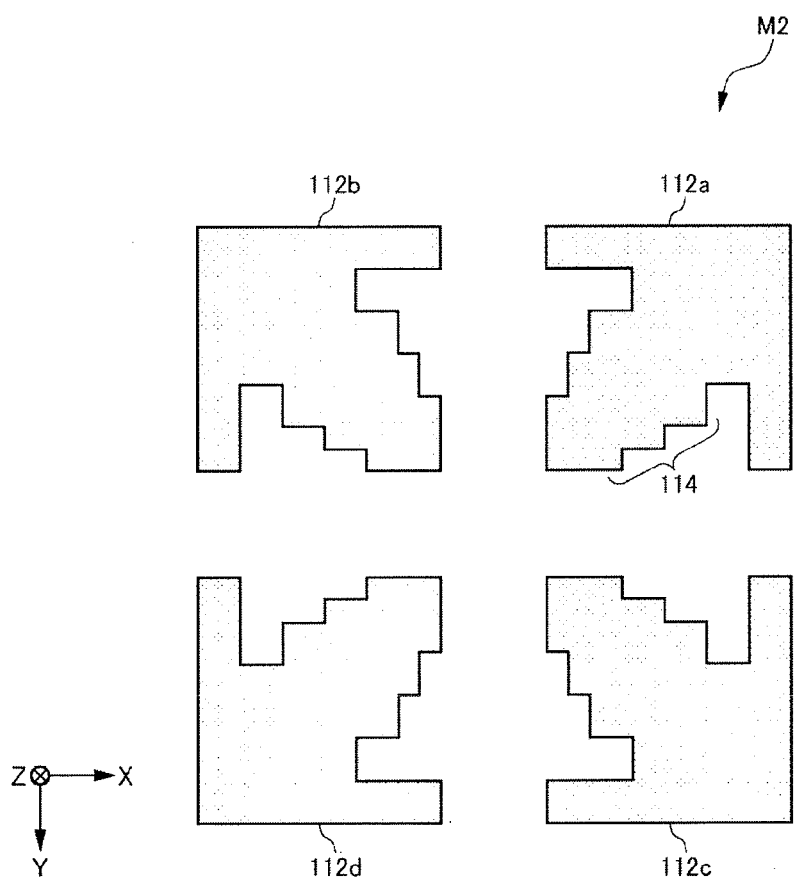
FIG. 7 shows the alignment mark M2 according to a first embodiment.

FIG. 7 shows the alignment mark M2 according to a first embodiment. In the first embodiment, the shape of the alignment mark M2 is changed to a shape shown in FIG. 7. While the shape of the alignment mark M1 is the same as the shape shown in FIG. 3A, that is, a cross shape, the alignment mark M1 can be about 60% thinner than conventional alignment marks.

The alignment mark M2 is the same as the alignment mark M2 of FIG. 3B in that the alignment mark M2 also surrounds the cross-shaped alignment mark M1 by four parts. However, stepped notches (a three-tier step pattern 114) are formed inside of each part (a portion 112) (a side of each part opposing the alignment mark M1). Four portions 112a to 112d can be completely separated from each other as shown in FIG. 7, or can be partially connected to each other. In any case, it suffices that the alignment mark M2 according to the first embodiment can surround the alignment mark M1 and the step pattern 114 is formed therein.

Figure 8:
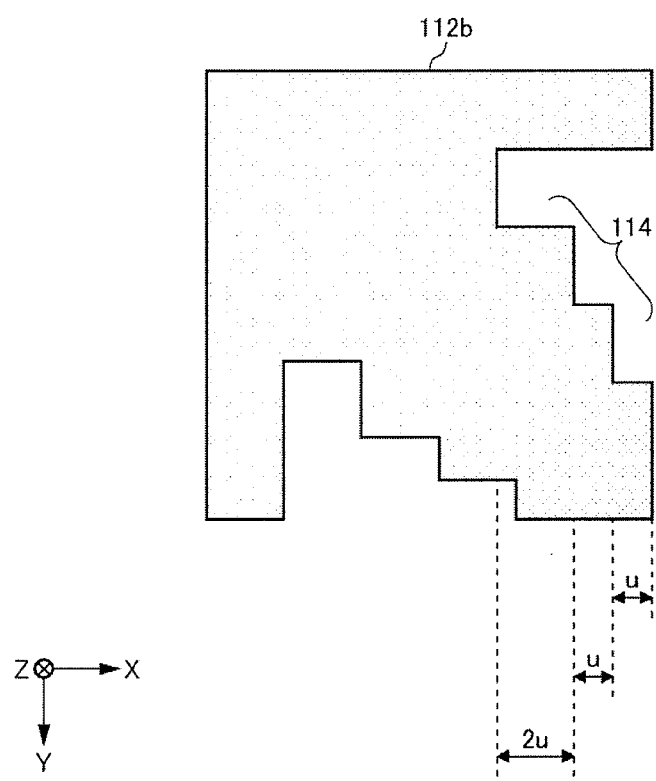
FIG. 8 is an enlarged view of a part of the cross-type alignment mark M2.

FIG. 8 is an enlarged view of the portion 112b. The step pattern 114 has steps of the unit $1u$, $1u$, and $2u$ in the X direction. $1u$ means an arbitrary unit length and, for example, $1u$ is 5 μm. The same holds true for a Y direction. However, there is no need to provide steps of $1u$, $1u$, and $2u$ also in the Y direction like the X direction. For example, steps of $2u$, $1u$, and $2u$ can be formed.

Figure 9:
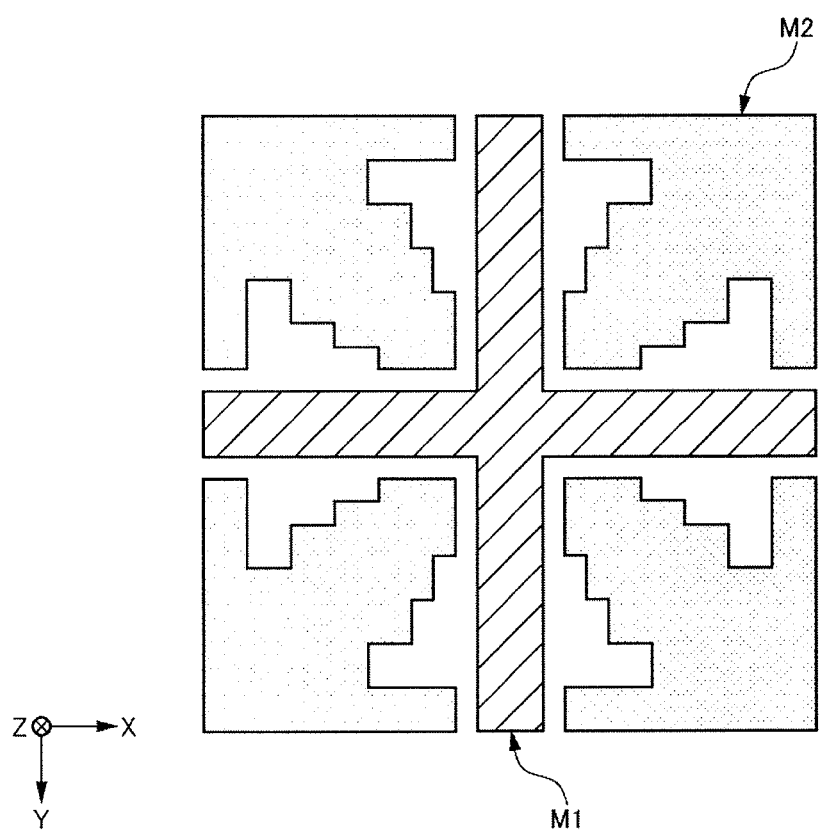
FIG. 9 shows a state where alignment of the alignment marks M1 and M2 is successful in the first embodiment.

FIG. 9 shows a state where alignment of the alignment marks M1 and M2 is successful in the first embodiment. The control unit 102 moves the stage 104 to a position where the alignment mark M1 on a surrounded side is completely surrounded by the alignment mark M2 on a surrounding side, in other words, to a position where the alignment mark M1 does not overlap the alignment mark M2.

Figure 10:
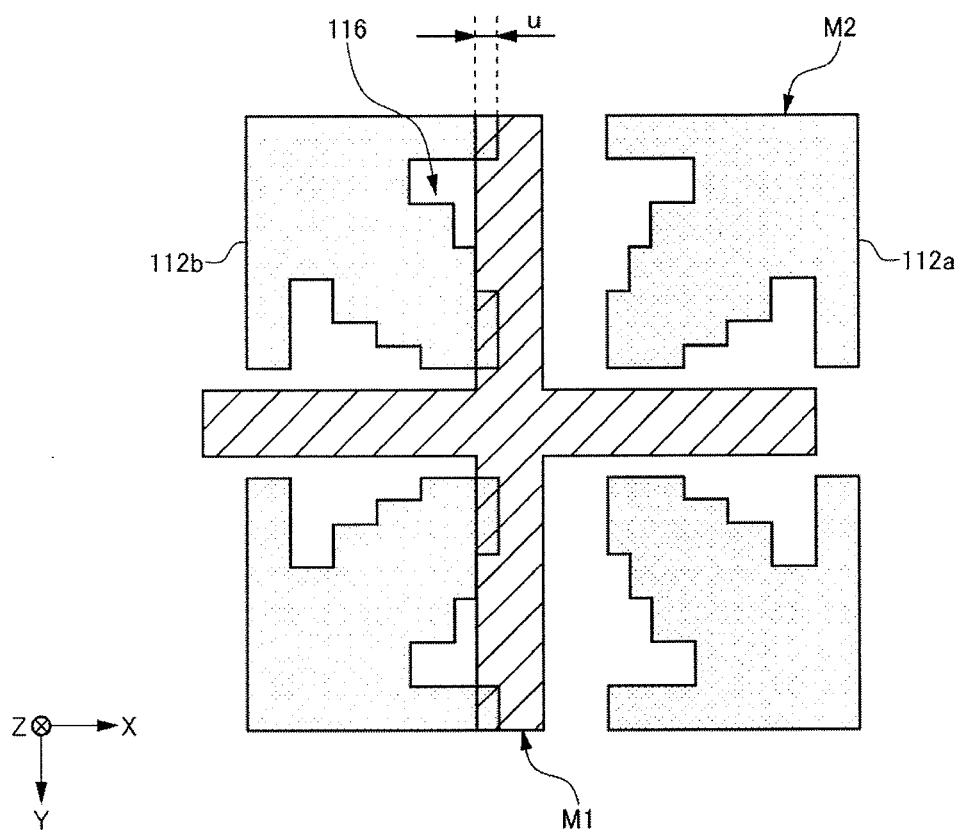
FIG. 10 shows a state where alignment of the alignment marks M1 and M2 is failed in the first embodiment.

FIG. 10 shows a state where alignment of the alignment marks M1 and M2 is failed in the first embodiment. In FIG. 10, the alignment mark M1 is shifted in the −X direction as compared to FIG. 9. Therefore, the alignment mark M1 is not completely surrounded by the alignment mark M2 and the alignment mark M1 partially overlaps the alignment mark M2. In the state of FIG. 10, the control unit 102 moves the alignment mark M1 in the +X direction.

According to the first embodiment, when the alignment mark M1 overlaps the alignment mark M2, a blank area 116 is detected. A part of the step pattern 114 can be confirmed in the blank area 116. More specifically, the amount of shifting can be confirmed on a 1u basis by the number of steps confirmed in the blank area 116. In the state of FIG. 10, it is confirmed that two steps are present in the blank area 116, and thus it is understood that the overlapping of the alignment marks M1 and M2 corresponds to 1u (in the X direction). Therefore, it suffices that the control unit 102 shifts the alignment mark M1 by 1u or more. When the alignment mark M1 is moved excessively, a blank area is formed between the portion 112a and the alignment mark M1, and thus the alignment mark M1 is moved back in the −X direction by the same method. With such a control method, the amount of left-right movement (movement in the X direction) can be finely adjusted. According to the alignment mark M2 of the first embodiment, not only the movement direction of the alignment mark M1 but also the amount of movement thereof is easy to be correctly estimated. The same holds true for the Y direction.

Figure 11:
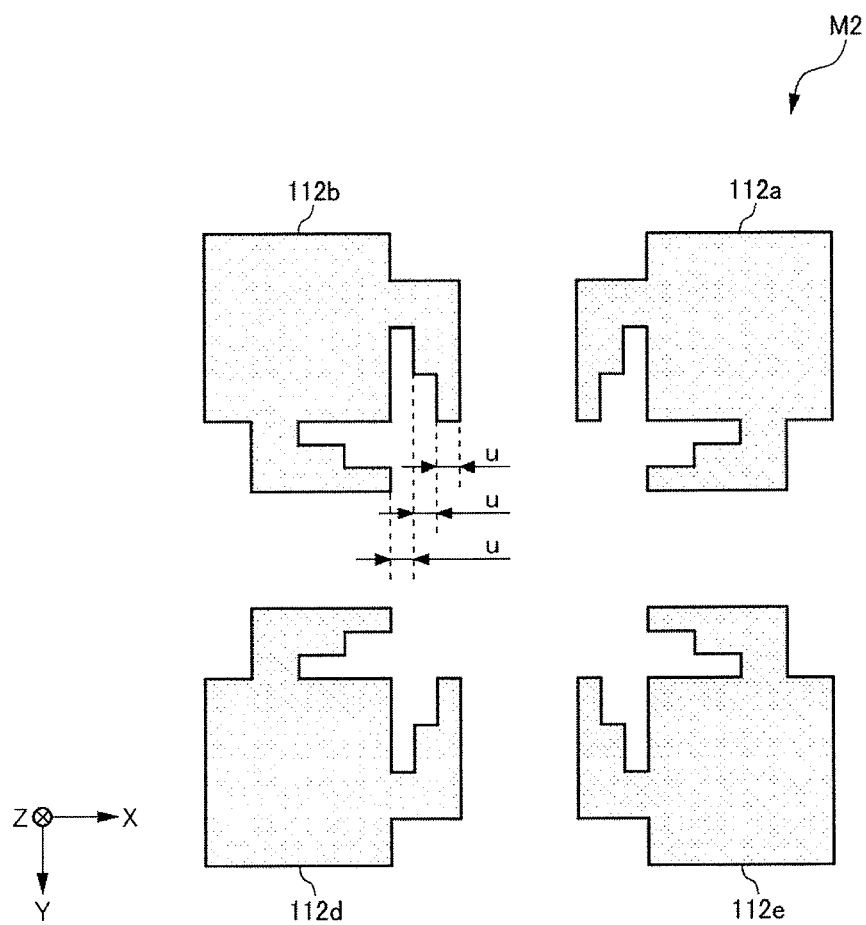
FIG. 11 shows the alignment mark M2 according to a modification of the first embodiment.

FIG. 11 shows the alignment mark M2 according to a modification of the first embodiment. The alignment mark M2 shown in FIG. 11 can also surround the alignment mark M1 and the step pattern 114 is also formed therein. However, the shape of the step pattern 114 is different from that of the alignment mark M2 shown in FIG. 7. While the alignment mark M2 shown in FIG. 7 has steps of the unit 1u, 1u, and 2u in the X direction and the Y direction, respectively, the alignment mark M2 shown in FIG. 11 has steps of the unit 1u, 1u, and 1u in the X direction and the Y direction, respectively.

Second Embodiment

Figure 12:
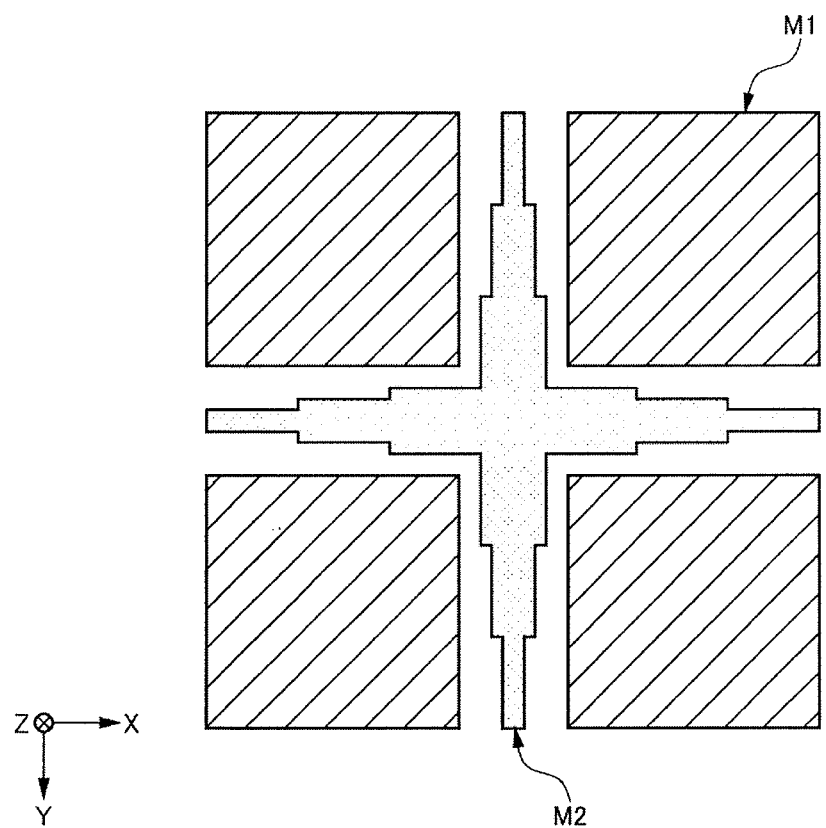
FIG. 12 shows a state where alignment of the alignment marks M1 and M2 is successful in the second embodiment.

FIG. 12 shows a state where alignment of the alignment marks M1 and M2 is successful in a second embodiment. In the second embodiment, a step pattern is formed not in the alignment mark M1 of the workpiece 106 but in the alignment mark M2 of the mask 108. The alignment mark M1 has a shape having four squares separated from each other like the alignment mark M2 shown in FIG. 3B, and the alignment mark M2 is formed in a cross shape like the alignment mark M1 shown in FIG. 3A. In the second embodiment, stepped notches are formed on outside of the alignment mark M2 on a surrounded side (a side of the alignment mark M2 opposing the alignment mark M1 on a surrounding side). Similarly to the alignment mark M2 of the first embodiment, the step pattern of the alignment mark M2 can include, for example, steps of the unit 1u, 1u, and 2u. The control unit 102 moves the stage 104 to a position where the alignment mark M2 on a surrounded side is completely surrounded by the alignment mark M1 on a surrounding side, in other words, to a position where the alignment mark M1 does not overlap the alignment mark M2. Even when a step pattern is formed not in an alignment mark on a surrounding side but in an alignment mark on a surrounded side, the amount of shifting can be confirmed on a 1u basis.

Figure 13:
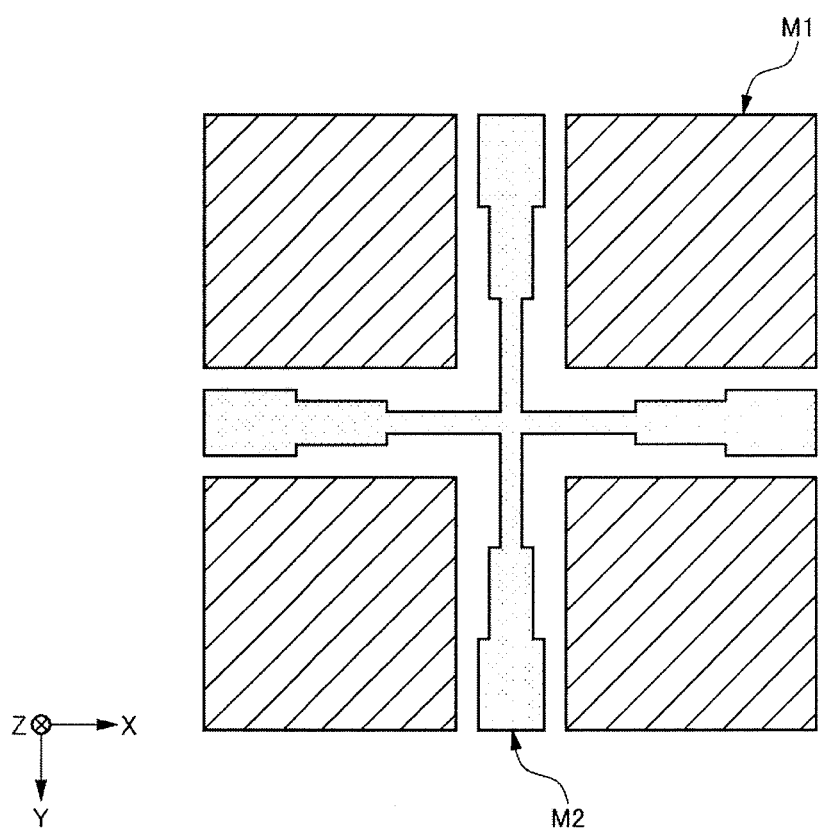
FIG. 13 shows a state where alignment of the alignment marks M1 and M2 is successful in a modification of the second embodiment.

FIG. 13 shows a state where alignment of the alignment marks M1 and M2 is successful in a modification of the second embodiment. Also in FIG. 13, the alignment mark M1 can surround the alignment mark M2 and a step pattern is formed on the outside of the alignment mark M2. However, the shape of the step pattern is different from that of the alignment mark M2 shown in FIG. 12. The alignment mark M2 shown in FIG. 12 is formed in a cross shape that becomes thinner radially from the central portion. In contrast, the alignment mark M2 shown in FIG. 13 is formed in a cross shape that becomes thicker radially from the central portion.

The manufacturing apparatus 100 of an electronic component that uses the alignment marks M1 and M2 has been explained based on the embodiments. Generally, because the alignment mark M1 of the workpiece 106 is formed by a plating method and the like, the shape of the alignment mark M1 tends to vary. On the other hand, the accuracy of forming the alignment mark M2 on the mask 108 is much higher than that of the alignment mark M1. Therefore, the alignment mark M2 of a complicated shape shown in FIG. 7 or 11 can be formed on the mask 108.

According to experiments of the present inventors, while the accuracy of alignment of the alignment mark M2 shown in FIG. 3B is about 10 μm, the accuracy of alignment of the alignment mark M2 shown in FIG. 7 is improved to about 5 μm. In other words, the accuracy of alignment is improved about twice as much as that in conventional techniques. In a stacked inductor, a terminal electrode of a first-layer coil is connected via a through hole to a terminal electrode of a second-layer coil. In such a stacked electronic component, it is necessary to have strict accuracy of alignment, and thus the manufacturing apparatus 100 described in the present embodiment is particularly effective.

By providing the alignment marks M1 and M2 at a plurality of positions as shown in FIG. 2, alignment control can be executed such that, among the shifting of the alignment mark M at the respective positions, the maximum shifting is minimized.

The present invention has been described based on the above embodiment. It should be understood by those skilled in the art that the above embodiment is merely exemplary of the invention, various modifications and changes may be made within the scope of the claims of the present invention, and all such variations may be included within the scope of the claims of the present invention. Thus, the descriptions and drawings in this specification should be considered as not restrictive but illustrative.

What is claimed is:

1. A manufacturing apparatus of an electronic component, the apparatus comprising:
   a substrate that has a first alignment mark;
   a mask for printing an electronic circuit pattern on the substrate, the mask having a second alignment mark; and
   a controller that performs alignment of the mask and the substrate based on the first and second alignment marks,
   wherein the first alignment mark comprises a plating and has a cross shape,
   the second alignment mark includes four parts that surround the first alignment mark from four orientations and has a plurality of step patterns in two directions corresponding to the cross shape of the first alignment mark, each of the step patterns has first to third steps arranged in this order from a center towards an exterior of the second alignment mark so as to increase, in a direction from the center towards the exterior, a space between two parts of the second alignment mark facing each other, a length of the first and second steps is one unit length and a length of the third step is two unit lengths, a smallest distance between the first and second alignment marks is provided at a junction of adjacent legs of the cross shaped second alignment mark; and the controller adjusts a relative position of the mask and the substrate based on an amount of overlap between the step patterns of the second alignment mark and a linear portion of the cross shape of the first alignment mark.

2. The manufacturing apparatus of the electronic component as claimed in claim 1, wherein the electronic circuit pattern is an inductor pattern.

3. The manufacturing apparatus according to claim 1, wherein a minimum space between the two parts of the second alignment mark facing each other is larger than a width of the linear portion of the cross shape of the first alignment mark.

4. A manufacturing apparatus of an electronic component, the apparatus comprising:
   a substrate that has a first alignment mark;
   a mask for printing an electronic circuit pattern on the substrate, the mask having a second alignment mark; and
   a controller that performs alignment of the mask and the substrate based on the first and second alignment marks,
   wherein the second alignment mark has a cross shape,
   the first alignment mark comprises a plating and includes four parts that surround the second alignment mark from four orientations,
   the second alignment mark has a plurality of step patterns in two directions corresponding to the cross shape of the second alignment mark,
   a smallest distance between the first and second alignment marks is provided at a junction of adjacent legs of the cross shaped first alignment mark; and
   the controller adjusts a relative position of the mask and the substrate based on an amount of overlap between the step patterns of the first alignment mark and the linear portion of the cross shape of the second alignment mark.

5. The manufacturing apparatus according to claim 4, wherein a space between two parts of the first alignment mark facing each other is larger than a maximum width of the linear portion of the cross shape of the second alignment mark.

6. A manufacturing method of an electronic component, the method comprising:
   moving at least one of a substrate and a mask for printing an electronic circuit pattern on the substrate to perform alignment of a first alignment mark of the substrate and a second alignment mark of the mask; and
   exposing to form the electronic circuit pattern on the substrate by using the mask after the alignment,
   wherein the first alignment mark comprises plating and has a cross shape,
   the second alignment mark includes four parts that surround the first alignment mark from four orientation and has a plurality of step patterns in two directions corresponding to the cross shape of the first alignment mark,
   each of the step patterns has first to third steps arranged in this order from a center towards an exterior of the second alignment mark so as to increase, in a direction from the center towards the exterior, a space between two parts of the second alignment mark facing each other,
   a length of the first and second steps is one unit length and a length of the third step is two unit steps,
   a smallest distance between the first and second alignment marks is provided at a junction of adjacent legs of the cross shaped second alignment mark; and
   the moving at least one of the substrate and the mask adjusts a relative position of the mask and the substrate based on an amount of overlap between the step patterns of the second alignment mark and a linear portion of the cross shape of the first alignment mark.

7. A manufacturing method of the electronic component as claimed in claim 6, wherein the electronic circuit pattern is an inductor pattern.

8. The manufacturing method according to claim 6, wherein a minimum space between the two parts of the second alignment mark facing each other is larger than a width of the linear portion of the cross shape of the first alignment mark.

9. A manufacturing method of an electronic component, the method comprising:
   moving at least one of a substrate and a mask for printing an electronic circuit pattern on the substrate to perform alignment of a first alignment mark of the substrate and a second alignment mark of the mask; and
   exposing to form the electronic circuit pattern on the substrate by using the mask after the alignment,
   wherein the second alignment mark has a cross shape,
   the second alignment mark comprises plating and includes four parts that surround the second alignment mark from four orientations,
   the first alignment mark has a plurality of step patterns in two directions corresponding to the cross shape of the second alignment mark,
   a smallest distance between the first and second alignment marks is provided at a junction of adjacent legs of the cross shaped first alignment mark; and
   the moving at least one of the substrate and the mask adjusts a relative position of the mask and the substrate based on an amount of overlap between the step patterns of the first alignment mark and a linear portion of the cross shape of the second alignment mark.

10. A manufacturing method of the electronic component as claimed in claim 9, wherein the electronic circuit pattern is an inductor pattern.

11. The manufacturing method according to claim 9, a space between two parts of the first alignment mark facing each other is larger than a maximum width of the linear portion of the cross shape of the second alignment mark.

* * * * *

UNITED STATES PATENT AND TRADEMARK OFFICE
CERTIFICATE OF CORRECTION

PATENT NO. : 9,532,461 B2
APPLICATION NO. : 14/224712
DATED : December 27, 2016
INVENTOR(S) : Ishikawa et al.

It is certified that error appears in the above-identified patent and that said Letters Patent is hereby corrected as shown below:

On the Title Page

Item (56), Other Publications, Column 2, Line 2, please change "an english" to -- an English --

In the Claims

Column 8, Line 4 (Claim 6, Line 12) please change "four orientation" to -- four orientations --
Column 8, Line 16 (Claim 6, Line 23) please change "unit steps" to -- unit lengths --

Signed and Sealed this
Thirteenth Day of June, 2017

Joseph Matal
*Performing the Functions and Duties of the*
*Under Secretary of Commerce for Intellectual Property and*
*Director of the United States Patent and Trademark Office*